United States Patent
Limqueco et al.

(10) Patent No.: US 6,543,037 B1
(45) Date of Patent: Apr. 1, 2003

(54) DELAY ESTIMATION FOR RESTRUCTURING THE TECHNOLOGY INDEPENDENT CIRCUIT

(75) Inventors: Johnson Chan Limqueco, Sunnyvale, CA (US); Hong Li, Fremont, CA (US); Krishna Belkhale, Campbell, CA (US); Devadas Varma, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/465,498

(22) Filed: Dec. 16, 1999

Related U.S. Application Data

(63) Continuation of application No. 08/818,498, filed on Mar. 14, 1997.

(51) Int. Cl.[7] .............................................. G06F 17/50
(52) U.S. Cl. ..................... 716/6; 716/2; 716/3; 716/10; 716/12
(58) Field of Search .............................. 716/2, 3, 6, 10, 716/12

(56) References Cited

U.S. PATENT DOCUMENTS

| | | | |
|---|---|---|---|
| 5,406,497 A | * | 4/1995 | Altheimer et al. .............. 716/6 |
| 5,475,605 A | * | 12/1995 | Lin .............................. 716/6 |

* cited by examiner

Primary Examiner—Matthew Smith
Assistant Examiner—Thuan Do
(74) Attorney, Agent, or Firm—Glenn Patent Group; Michael A. Glenn

(57) ABSTRACT

Provided are a method, article of manufacture, and apparatus for estimating delays of networks. An automated design system comprises a computer configured to identify a critical path in a network, calculate a delay for the technology-mapped version of the network, calculate a delay for the technology-independent version of the network, calculate a scale factor from the technology-mapped and technology-independent delays, and apply the scale factor to all the delays in the technology-independent network.

48 Claims, 4 Drawing Sheets

DELAY ESTIMATION FOR RESTRUCTURING THE TECHNOLOGY INDEPENDENT CIRCUIT

CROSS REFERENCE TO RELATED APPLICATION(S)

This is a continuation of application Ser. No. 08/818,498, which was filed on Mar. 14, 1997.

TECHNICAL FIELD

This invention relates to a method, article of manufacture, and apparatus for logic synthesis and mapping a technology-independent network to a technology-dependent network in the design of integrated circuits. More particularly, this invention relates to estimating delays of networks.

BACKGROUND

In the design of integrated circuits, there is a tradeoff between competing design goals: area of the circuit, critical path delay (speed) of the circuit, testability of the circuit, and power consumption of the circuit. The rapidly growing complexity in very large scale integrated (VLSI) circuits and the sheer mass of detail in VLSI designs necessitates the use of automated synthesis tools in order to design an optimized circuit which balances all of these design constraints. Logic synthesis is described in *Logic Synthesis and Verification Algorithms*, by Gary D. Hachtel and Fabio Somenzi, and in *Synthesis and Optimization of Digital Circuits*, by Giovanni De Micheli, the disclosures of which are hereby incorporated by reference.

Automated design systems are used in converting logic designs to specific circuits in the production of application specific integrated circuits (ASICs). This typically involves mapping the logic design, called a "technology-independent circuit" (or network), into one or more logic gates in a pre-designed set of gates called a technology library. The resulting circuit may be variously called "technology-dependent", "technology-mapped", or simply "mapped".

The technology library depends on the manufacturer and the target technology selected.

For example, et technologies might include CMOS (complementary metal-oxide-semiconductor), NMOS (n-type metal-oxide-semiconductor), PMOS (p-type metal-oxide-semiconductor), TTL (bipolar transistor-to-transistor logic), and ECL (emitter-coupled logic). Further differentiation among target technologies may be based on minimum feature size, resulting in, for example, a 0.25 micron CMOS technology, a 1.0 micron CMOS technology, and a 2.0 micron CMOS technology.

Initially, the logic design may be specified in the form of Boolean equations or an HDL (hardware description language) description in a language such as Verilog or VHDL (Very High Speed Integrated Circuits Hardware Description Language). The automated design system generates a technology-independent, unmapped network that is a directed graph where the vertices represent logic gates and the edges represent the nets connecting the gate outputs to gate inputs. This technology-independent network is optimized and mapped, producing a technology-mapped network. Typically, some restructuring is performed in order to meet specified design criteria (delay times, area, etc.). This is generally a repetitive optimizing process that involves countless changes to the logic network, with many recalculations of various network parameters after each change. One such parameter is speed, which is related to the time required for a change in one of the inputs to travel through the network to produce a change in one of the outputs.

Most target technology libraries contain timing information for various cells in the library, which can be used to accurately determine the delays in a mapped network. However, the restructuring is performed at the technology-independent level, and as stated above, many changes may be made to the logic network. Mapping the network and recalculating delays after every change would dramatically increase the computation required, and for larger, more complex circuits, this would render the task intractable.

Thus, automated design systems typically estimate the delay from the technology-independent network, without mapping each change to determine the effect of the change on the timing. One method of estimating time delay in a technology-independent network is to determine the length of the longest dependency chain present in the network. The dependency chain is thought of as the "critical path", and its length as the "critical path delay". This critical path is the limiting factor in the speed of the circuit, and the restructuring process focuses on reducing the critical path delay in order to meet timing requirements. Typically, a fixed delay is assigned to each of the logic vertices, and the estimated time delay is a function of the delays of the vertices in the critical path. This method has the advantage of simplicity, but fails to account for the complexity of the functions, the effect of the mapping and optimization on the mapped network time delay, or the characteristics of the target technology. Often, the estimated delays do not accurately characterize the actual delays of the mapped network.

Another method, described in U.S. Pat. No. 5,500,808, issued Mar. 19, 1996, attempts to include the fanins and fanouts for each logic node in estimating the delay of the unmapped network. Other methods have been used, with varying degrees of success and computational tractability.

Furthermore, restructuring programs generally focus on the critical path. Because the technology-independent network has estimated time delays and may not even have the same structure as the technology-mapped network, the critical path of the technology-independent network may not be the same as the critical path of the technology-mapped network. This may result in poor performance of the restructuring program.

Thus, there is a need for a method and apparatus for estimating time delays with a high degree of accuracy and which is not so complex as to require substantially increased computation, and for improved critical path selection to guide the restructuring process.

SUMMARY OF THE INVENTION

Briefly, therefore, this invention provides for a method, article of manufacture, and apparatus for estimating delays of networks. An automated design system comprises a computer configured to identify a critical path in a network, calculate a delay for the technology-mapped version of the network, calculate a delay for the technology-independent version of the network, calculate a scale factor from the technology-mapped and technology-independent delays, and apply the scale factor to all the delays in the technology-independent network.

In an embodiment of the invention, an automated design system processes a circuit which has been mapped to a chosen technology. The system identifies a critical path in the technology-mapped circuit and computes the critical path delay using information from the chosen technology library. The technology-mapped circuit is then unmapped into a technology-independent circuit using inverters and two-input representative functions such as NAND. The delays of an inverter cell and of a two-input representative function cell are determined using the delay information of such cells from the chosen technology library. The automated design system then identifies a critical path in the technology-independent circuit based on the critical path in the technology-mapped circuit, and computes its delay using the inverter and representative function cell delays. The technology-mapped critical path delay is divided by the technology-independent critical path delay to obtain a scale factor, which is applied to all the delays in the technology-independent circuit to produce estimated delays.

The advantages and further details of the present invention will become apparent to one skilled in the art from the following detailed description when taken in conjunction with the accompanying drawings.

DESCRIPTION OF THE INVENTION

Figure 1:
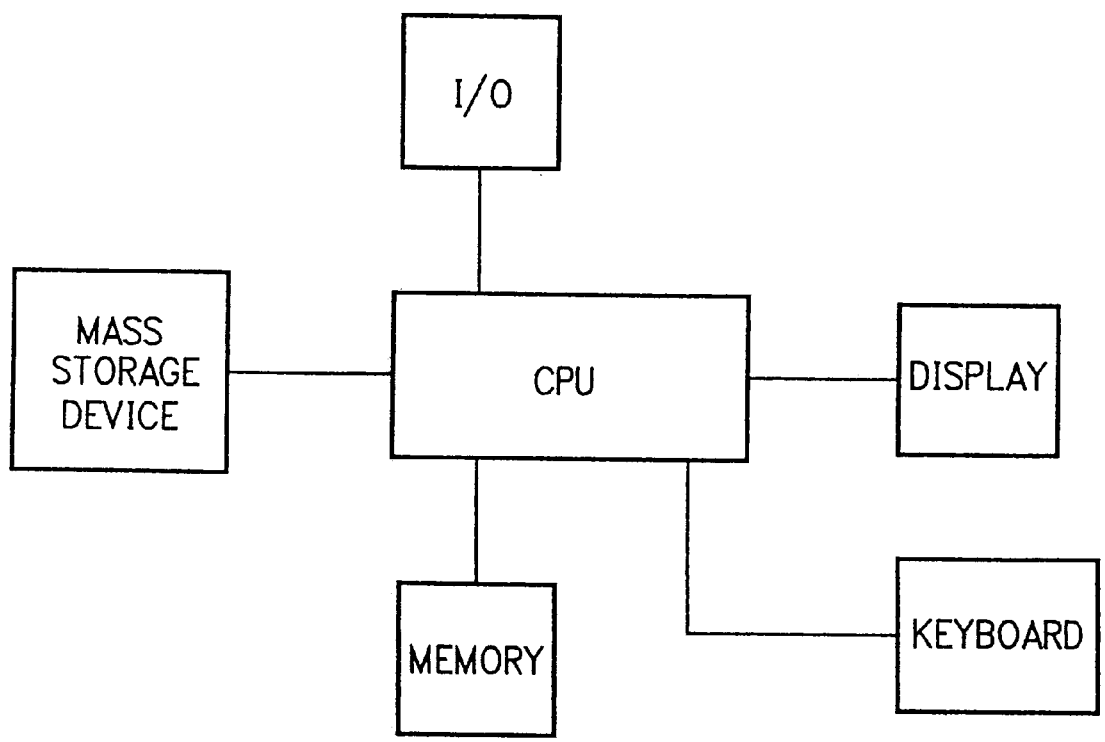
FIG. 1 is a schematic of an automated design system in accordance with the invention.

In accordance with the invention, an automated design system comprises a computer configured to convert a logic design to a specific circuit. In an embodiment of the invention, the automated design system is in the form of a software program being executed on a general-purpose computer such as a DEC Alpha or an Intel Pentium-based PC running Linux. Other means of implementing the automated design system may be used, such as a special-purpose hardwired system with instructions burned into a chip. As is usual in the industry, the computer may have memory, a display, a keyboard, a mass storage device, and other input or output devices, shown in FIG. 1. In accordance with common practice, the memory and the mass storage device can be used to store program instructions and data.

The system is configured to map the logic design into one or more logic gates from a chosen technology library. The technology library may vary depending on the manufacturer and the product line selected. For example, the target technologies may include different processes such as CMOS, NMOS, PMOS, TTL, or ECL with different minimum feature sizes, and emphasize different performance goals. One target technology may emphasize minimum area and power consumption, while another target technology emphasizes speed.

Typically, the logic design is initially provided in the form of Boolean equations or an HDL (hardware description language) description in a language such as Verilog or VHDL (Very High Speed Integrated Circuits Hardware Description Language). The automated design system converts this to a technology-independent, unmapped network that is a directed graph where the vertices represent logic gates and the edges represent the nets connecting the gate outputs to gate inputs.

The Verilog description corresponding to the circuit FIG. 2 would be as follows:
```
module sample (a,b,c,d,x,y);
   input a,b,c,d;
   output x,y;
   assign x=(a & b)|c;
   assign y=c & d;
endmodule
```

A logic optimizer optimizes the technology-independent network, which is then mapped to produce a technology-mapped network. Thereafter, restructuring of the network is performed in order to meet specified design parameters such as delay times, area, and power consumption. This involves repeatedly altering the network and recalculating the various parameters of the network after each alteration to determine whether they meet the specified parameters. If the parameters are not met, the network is altered again and the parameters recalculated. However, if the parameters are met, or if the system determines that further progress is impossible or impractical, the system produces a mapped network which has been optimized to the extent possible/practical. One of the specified parameters may, for example, be delay time, which is the time required for a change in one of the inputs to travel through the network to produce a change in one of the outputs.

In overview, the automated design system performs the following:

1) Extract a critical section of the network.
2) Unmap the section into a technology-independent network.
3) Determine the scale factor.
4) Scale the technology-independent network delays.
5) Restructure the technology-independent network.
6) Map the technology-independent network.

These steps iterated until the design constraints are met, or no more improvement can be achieved.

Figure 2:
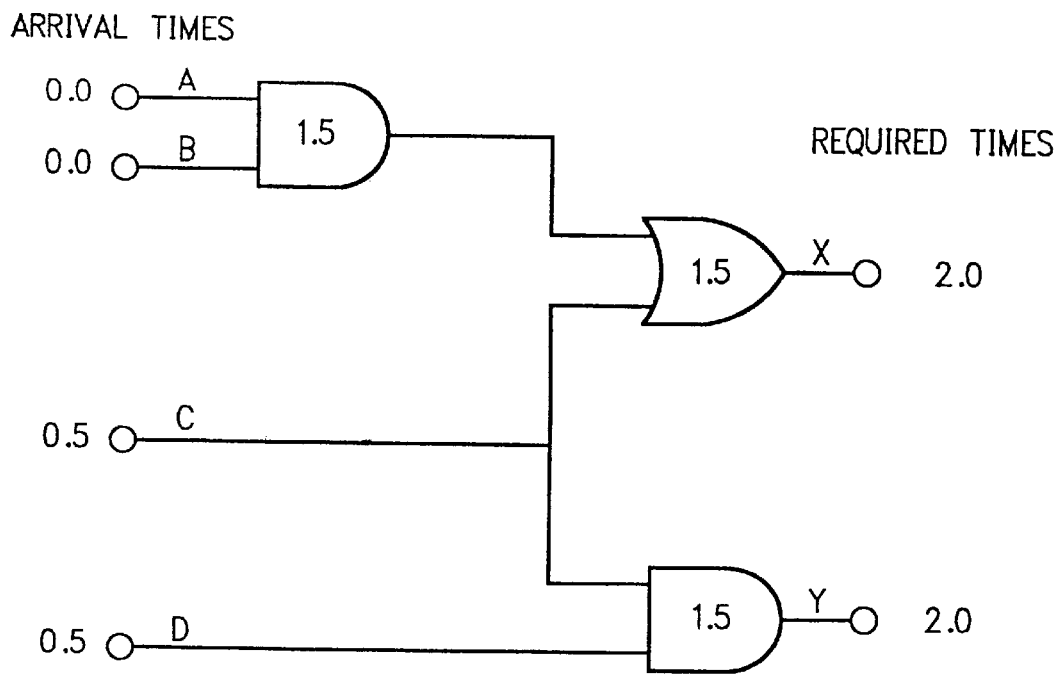
FIG. 2 is a schematic of a technology-mapped circuit.

More specifically, the system uses a first technology-mapped network, shown in FIG. 2, which was produced from the technology-independent network by the mapper using the chosen technology library. The mapping process involves converting the technology-independent circuit into the technology-mapped circuit using the chosen target technology library. The library typically contains functional and timing information or each cell, in addition to other information such as area. The mapping process generally starts off with decomposing the network into representative functions. In one approach, pattern-matching is used, where each library cell is represented by different networks built out of the representative functions. These networks realize the same logic function as that of the library cell and are called patterns. The decomposed network is thus mapped by covering it with pattern matches; i.e., for each section of the circuit, a cell with a pattern that matches the pattern of that section can be used to implement the function of that section of the circuit. All such matches are recorded and the best covering in terms of either area or delay is obtained through some algorithm such as dynamic programming to obtain the mapped netlist.

In another approach to mapping, functional matching is used, where the function of each cell is represented using some form such as an ordered BDD (Binary Decision Diagram) instead of network patterns. The function of each section of the circuit to be matched is then calculated based on the input boundaries of the section. Matching is then performed by looking for cells in the library that have the same function.

After mapping, the critical path in the technology-mapped network is identified by summing the delays of the vertices in each path, and choosing the path with the largest delay. The delays of the vertices are determined from the cell delay information given in the technology library, and are summoned for each path to produce the path delay. The path with the latest signal arrival time is considered to be the actual delay of the critical path, because the validity of the circuit's output depends on the arrival of the correct signal at the path with the latest signal arrival time. In the network of FIG. 2, the critical path is (A,B)→X, and the actual critical path delay is $d_r=1.5+1.5=3.0$. The other paths, such as C→X, C→Y, and D→Y, each have a delay of 0.5+1.5=2.0, with the arrival time of the signal being included in computation of the delay. Typically, the delays are given in nanoseconds, but may be given in other units.

The timing of this technology-mapped network is checked against the specified timing parameters. If it does not meet the requirements, or if some other actual parameter of the technology-mapped network does not meet design criteria, the system unmaps the mapped network into a technology-independent network using primitive gates whose delays are characterized in the chosen technology library. Taking the network of FIG. 2, the delay of (A,B)→X is 3.0, which exceeds the required time of 2.0. This requires the network to be restructured to reduce the delay. Typically, the primitive gates for unmapping are chosen such that any function can be represented using only those primitive gates. For example, the technology-independent network shown in FIG. 3 has been created by unmapping the technology-mapped network using inverters (INV) and 2-input NAND gates. Other primitive gates may be chosen, such as inverters and NOR gates, and they may have any number of inputs.

The delays of the chosen primitive gates are characterized using the timing information from the chosen technology library. In the example shown in FIG. 3, the inverter has a delay of 0.5 and the NAND gate has a delay of 1.5. Note that for the network of FIG. 3, the delays of the nodes in each path sum to 2.0. All paths appear to be equally critical, which affects the ability of the restructuring program to identify areas to be optimized during restructuring. This may cause the restructuring program to focus on the wrong path in optimization and produce suboptimal results. In addition to the apparent equal criticality of the paths, they all appear to meet the timing requirements at the outputs. However, this is not consistent with the results from the mapped network, in which the path (A,B)→X was the critical path and failed to meet the timing requirements. For other networks, other paths may appear to be critical, such as C→X or D→Y. Again, the restructuring program may focus on the wrong path in the restructuring process.

Therefore, to produce more accurate delay times and provide better guidance to the restructuring program in critical path selection, the automated design system chooses an apparent critical path based on the critical path identified in the technology-mapped network, which was (A,B)→X. For the technology-independent network of FIG. 3, the delay of the apparent critical path is $d_i 1.0+1.0=2.0$. This is the estimated critical path delay. To obtain the scale factor, the automated design system (or an arithmetic logic unit) divides the actual critical path delay by the estimated critical path delay. For the networks of FIGS. 2 and 3, this produces $S=d_r/d_i=3.0/2.0=1.5$.

Figure 3:
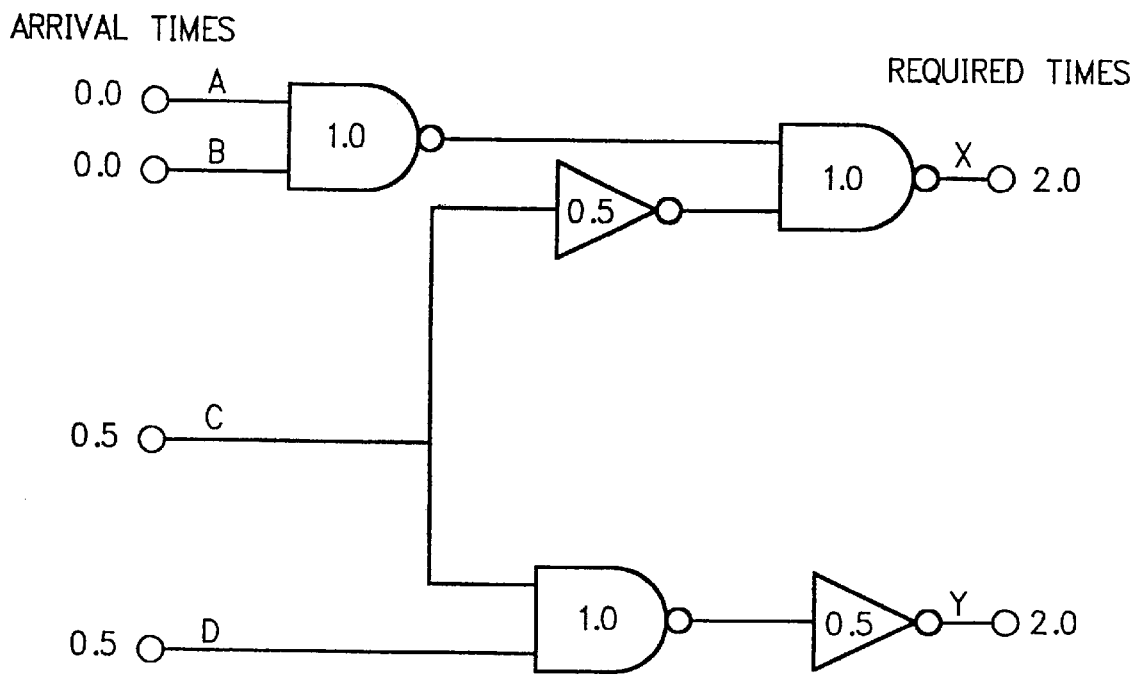
FIG. 3 is a schematic of a technology-independent circuit equivalent to the circuit of FIG. 2.

The scale factor $S=1.5$ is applied to every node in the network of FIG. 3. Each delay is multiplied by 1.5 to produce the technology-independent network shown in FIG. 4. For example, each 2-input NAND gate has a characterized delay of 1.0, which is multiplied by the scale factor of 1.5 to produce an estimated delay of 1.5. The inverter has a characterized delay of 0.5, which is multiplied by 1.5 to produce an estimated delay of 0.75.

Figure 4:
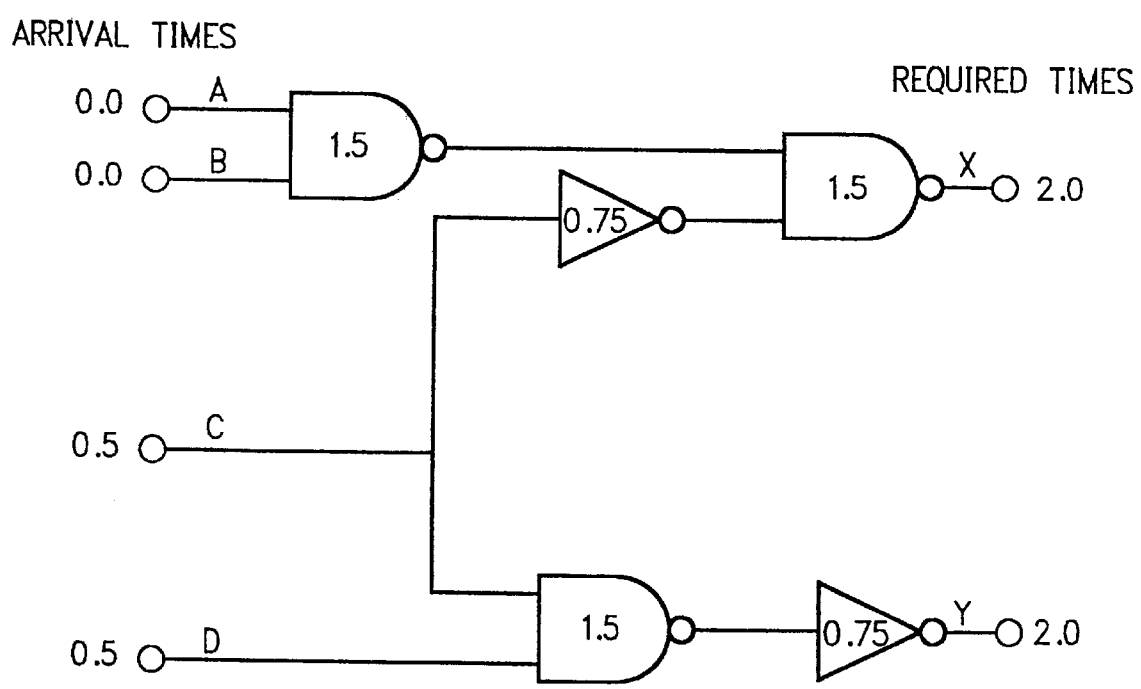
FIG. 4 is a somatic of the circuit of FIG. 3 illustrating an application of a scale factor in accordance with the invention.

In the network of FIG. 4, the path delay for (A,B)→X is 1.5+1.5=3.0. For the other paths, C→X gives 0.5+0.75+1.5=2.75, C→Y gives 0.5+1.5+0.75=2.75, and D→Y gives 0.5+1.5+0.75=2.75. Thus, (A,B)→X is the critical path, which corresponds to the critical path (A,B)→X identified in the technology-mapped network of FIG. 2.

Using the identified critical path, the restructuring program restructures the technology-independent network. The restructuring program restructures the network until it cannot find any improvement based on its estimate of delays (which are based on the scaled delay times in the network). Thereafter, the network is mapped and checked to determine whether the constraints have been met or no further improvement is possible. If the constraints have not been met and further improvements can be made, the mapped network is again unmapped, a scale factor computed, scaled, restructured, and mapped.

Figure 5:
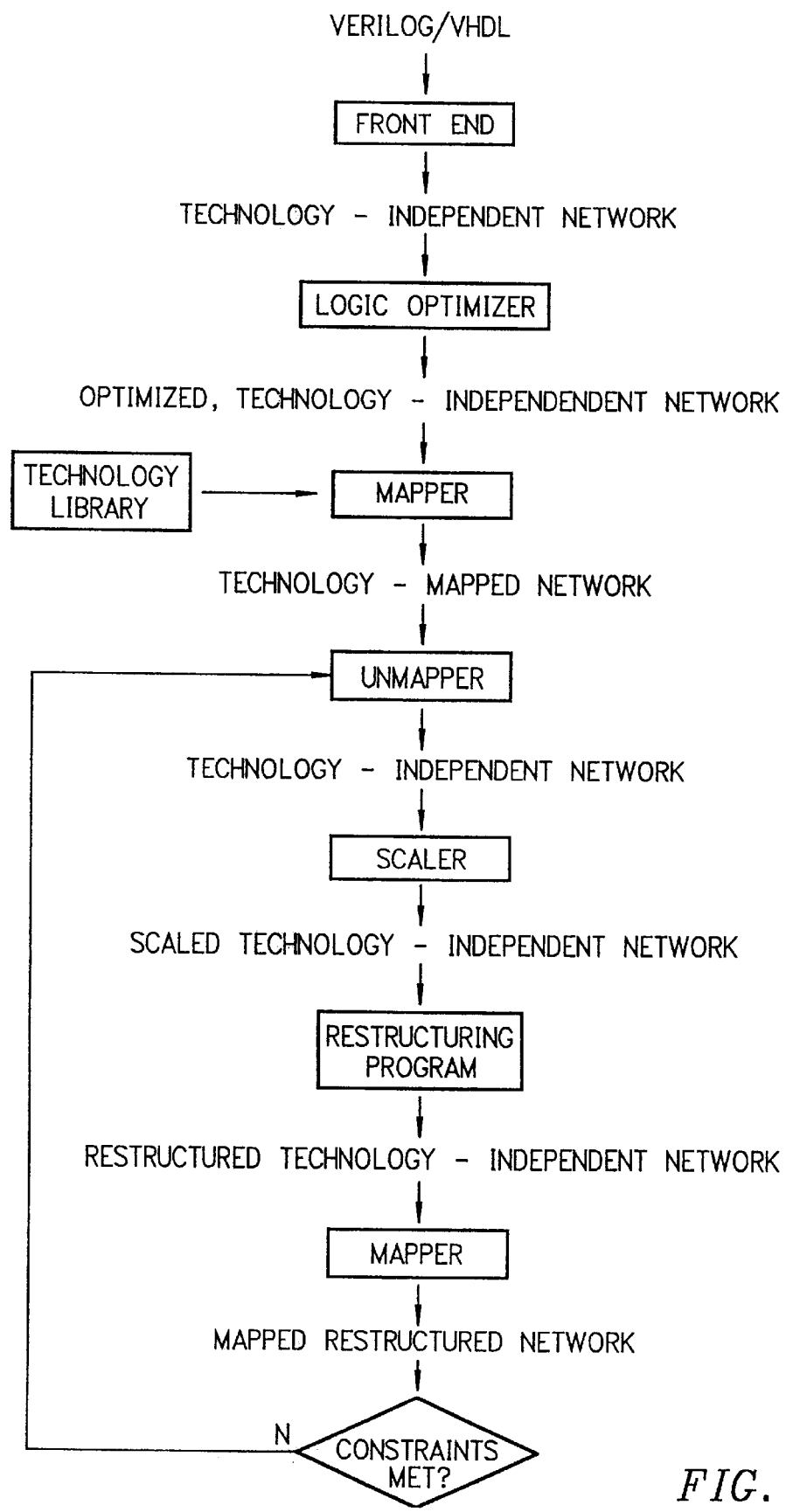
FIG. 5 is a schematic illustrating the process flow of the invention.

This process can be applied to different parts of the circuit, by working on relatively small parts of the circuit at a time. The system may repeatedly extract a small critical region, unmap it, scale it, restructure it, and map it. This approach appears to produce more accurate delay modeling, with resultant improvements in optimization. FIG. 5 illustrates the flow of the overall process.

In short, as stated above, the automated design system would not be able to identify the critical path from the technology-independent network of FIG. 3 because all paths appear to be equally critical, but after the delays have been scaled, the critical path can be identified. Greater accuracy in estimation of delays is important, because inaccuracy in delay estimation increases the likelihood that relative criticality of the signals will not match that of the mapped circuit, which could lead to incorrect restructuring decisions. In addition to the identification of the critical path, the improvement in delay estimation aids the restructuring program in deciding how to restructure the network.

The invention may thus be used to assist the automated design system in identifying the critical path for restructuring the technology-independent network. Further, because the delay estimation has been made more accurate, the automated design system will be more likely to make correct choices about how to restructure the critical path that it has identified, and can better assess the timing performance of the restructured network without mapping it.

All references cited herein are intended to be incorporated by reference. Although the present invention has been described above in terms of a specific embodiment, it is anticipated that alterations and modifications to this invention will no doubt become apparent to those skilled in the art. It is therefore intended that the following claims be interpreted as covering all such alterations and modifications as fall within the true spirit and scope of the invention.

What is claimed is:

1. A method of estimating delays in a circuit, comprising the steps of:

(a) selecting a first path in the circuit;

(b) calculating a technology-mapped delay for the first path;

(c) calculating a technology-independent delay for the first path;

(d) calculating a scale factor from the technology-mapped delay and the technology-independent delay; and (e) applying the scale factor to at least one delay in the circuit.

2. The method as recited in claim 1, wherein the step of selecting the first path includes choosing a critical path in the circuit.

3. The method as recited in claim 2, wherein the step of calculating the scale factor includes dividing the technology-mapped delay by the technology-independent delay.

4. The method as recited in claim 3, wherein the step of applying the scale factor includes multiplying the at least one delay by the scale factor.

5. The method as recited in claim 4, further comprising the step of converting a technology-mapping of the circuit to a technology-independent form of the circuit.

6. The method as recited in claim 5, wherein the step of applying the scale factor includes applying the scale factor to at least one delay in the technology-independent circuit.

7. The method as recited in claim 5, wherein the step of converting the technology-mapped circuit to the technology-independent circuit includes choosing representative functions such that every function in the technology-mapped circuit can be represented in the technology-independent circuit.

8. The method as recited in claim 7, wherein the representative functions are included in a set selected from the group consisting of {NAND,INV}, {NOR, INV}, {AND, INV}, {OR, INV}, and {NOR, NAND, INV}.

9. The method as recited in claim 8, wherein the representative functions are 2-input NAND and INV.

10. The method as recited in claim 7, wherein the representative functions are chosen from a technology library, and further comprising the step of determining at least one characterized delay from the technology library for at least one of the representative functions.

11. The method as recited in claim 10, wherein the step of calculating the technology-independent delay includes using the at least one characterized delay.

12. The method as recited in claim 5, wherein the step of converting is performed before the step of calculating the technology-independent delay, and the step of calculating the technology-independent delay includes choosing an apparent critical path corresponding to the first path.

13. A method of optimizing a circuit, comprising the steps of:
(a) producing a technology-mapped form of the circuit;
(b) identifying a technology-mapped critical path in the technology-mapped circuit;
(b) producing a technology-independent form of the circuit;
(c) calculating a scale factor;
d) applying the scale factor to the technology-independent circuit; and
(e) restructuring the technology-independent circuit.

14. The method as recited in claim 13, wherein the step of calculating the scale factor includes the steps of:
(a) calculating a technology-mapped delay for the first path;
(b) calculating a technology-independent delay for the first path; and
(c) dividing the technology-mapped delay by the technology-independent delay.

15. The method as recited in claim 14, wherein the step of calculating the technology-independent delay includes choosing an apparent critical path corresponding to the technology-mapped critical path.

16. The method as recited in claim 14, wherein the step of applying the scale factor includes multiplying at least one delay in the technology-independent circuit by the scale factor to produce at least one scaled delay.

17. The method as recited in claim 16, wherein the step of producing the technology-independent circuit includes choosing representative functions such that every function in the technology-mapped circuit can be represented in the technology-independent circuit, and unmapping the technology-mapped circuit.

18. The method as recited in claim 17, wherein the representative functions are included in a set selected from the group consisting of {NAND,INV}, {NOR, INV}, {AND, INV}, {OR, INV}, and {NOR, NAND, INV}.

19. The method as recited in claim 18, wherein the representative functions are chosen from a technology library, and further comprising the step of determining at least one characterized delay from the technology library for at least one of the representative functions.

20. The method as recited in claim 19, wherein the step of calculating the technology-independent delay includes using the at least one characterized delay.

21. The method as recited in claim 20, wherein the step of producing the technology-independent circuit includes the step of extracting a critical section from the circuit before unmapping the circuit.

22. The method as recited in claim 16, wherein the step of restructuring includes the step of identifying a technology-independent critical path using the at least one scaled delay.

23. The method as recited in claim 22, further comprising the step of checking the restructured circuit against design constraints.

24. The method as recited in claim 23, wherein the steps of producing the technology-mapped circuit, identifying the technology-mapped critical path, producing the technology-independent circuit, calculating the scale factor, applying the scale factor, and restructuring the technology-independent circuit are repeated to optimize the circuit.

25. A computer program product for estimating delays in a circuit, comprising a computer usable medium having machine readable code embodied therein for performing the steps of:
(a) selecting a first path in the circuit;
(b) calculating a technology-mapped delay for the first path;
(c) calculating a technology-independent delay for the first path;
(d) calculating a scale factor from the technology-mapped delay and the technology-independent delay; and
(e) applying the scale factor to at least one delay in the circuit.

26. The computer program product as recited in claim 25, wherein the step of selecting the first path includes choosing a critical path in the circuit.

27. The computer program product as recited in claim 26, wherein the step of calculating the scale factor includes dividing the technology-mapped delay by the technology-independent delay.

28. The computer program product as recited in claim 27, wherein the step of applying the scale factor includes multiplying the at least one delay by the scale factor.

29. The computer program product as recited in claim 28, wherein the machine readable code is further for performing the step of converting a technology-mapping of the circuit to a technology-independent form of the circuit.

30. The computer program product as recited in claim 29, wherein the step of applying the scale factor includes applying the scale factor to at least one delay in the technology-independent circuit.

31. The computer program product as recited in claim 29, wherein the step of converting the technology-mapped circuit to the technology-independent circuit includes choosing representative functions such that every function in the technology-mapped circuit can be represented in the technology-independent circuit.

32. The computer program product as recited in claim 31, wherein the representative functions are included in a set selected from the group consisting of {NAND,INV}, {NOR, INV}, {AND, INV}, {OR, INV}, and {NOR, NAND, INV}.

33. The computer program product as recited in claim 32, wherein the representative functions are 2-input NAND and INV.

34. The computer program product as recited in claim 31, wherein the representative functions are chosen from a technology library, and wherein the machine readable code is further for performing the step of determining at least one characterized delay from the technology library for at least one of the representative functions.

35. The computer program product as recited in claim 34, wherein the step of calculating the technology-independent delay includes using the at least one characterized delay.

36. The computer program product as recited in claim 29, wherein the step of converting is performed before the step of calculating the technology-independent delay, and the step of calculating the technology-independent delay includes choosing an apparent critical path corresponding to the first path.

37. An automated design system for estimating delays in a circuit, comprising:
(a) a processor; and
(b) a memory in communication with the processor; wherein the processor is configured to select a first path in the circuit, calculate a technology-mapped delay for the first path, calculate a technology-independent delay for the first path, calculate a scale factor from the technology-mapped delay and the technology-independent delay, and apply the scale factor to at least one delay in the circuit.

38. The automated design system as recited in claim 37, wherein the processor is further configured to select the first path by choosing a critical path in the circuit.

39. The automated design system as recited in claim 38, wherein the processor is further configured to calculate the scale factor by dividing the technology-independent delay into the technology-mapped delay.

40. The automated design system as recited in claim 39, wherein the processor is further configured to apply the scale factor by multiplying the at least one delay by the scale factor.

41. The automated design system as recited in claim 40, wherein the processor is further configured to convert a technology-mapping me circuit to a technology-independent form of the circuit.

42. The automated design system as recited in claim 41, wherein the processor is further configured to apply the scale factor to at least one delay in the technology-independent circuit.

43. The automated design system as recited in claim 41, wherein the processor is further configured to convert the technology-mapped circuit to the technology-independent circuit by choosing representative functions such that every function in the technology-mapped circuit can be represented in the technology-independent circuit.

44. The automated design system as recited in claim 43, wherein the representative functions are included in a set selected from the group consisting of {NAND,INV}, {NOR, INV}, {AND, INV}, {OR, INV}, and {NOR, NAND, INV}.

45. The automated design system as recited in claim 44, wherein the representative functions are INV and 2-input NAND.

46. The automated design system as recited in claim 43, wherein the processor is further configured to choose e the representative functions are chosen from a technology library, and to determine at least one characterized delay from the technology library for at least one of the representative functions.

47. The automated design system as recited in claim 46, wherein the processor is further configured to use the at least one characterized delay in calculating the technology-independent delay.

48. The automated design system as recited in claim 41, wherein the processor is further configured to convert the technology-mapping to the technology-independent form before calculating the technology-independent delay, and to calculate the technology-independent delay by choosing an apparent critical path corresponding to the first path.

* * * * *